United States Patent [19]

Honda

[11] 4,394,590
[45] Jul. 19, 1983

[54] FIELD EFFECT TRANSISTOR CIRCUIT ARRANGEMENT

[75] Inventor: Akira Honda, Odawara, Japan

[73] Assignee: International Rectifier Corp. Japan Ltd., Kanagawa, Japan

[21] Appl. No.: 197,099

[22] PCT Filed: Dec. 28, 1979

[86] PCT No.: PCT/JP79/00330
§ 371 Date: Aug. 28, 1981
§ 102(e) Date: Jul. 7, 1980

[87] PCT Pub. No.: WO81/01924
PCT Pub. Date: Jul. 9, 1981

[51] Int. Cl.³ .................... H03K 17/10; H03K 17/687
[52] U.S. Cl. .................................... 307/584; 307/571; 307/296 R
[58] Field of Search ................. 307/254, 296 R, 304, 307/571, 573, 574, 575, 577, 583, 584

[56] References Cited

U.S. PATENT DOCUMENTS 3,007,061 10/1961 Gindi .................... 307/254
4,100,438 7/1978 Yokoyama ............. 307/304
4,317,055 2/1982 Yoshida et al. ........ 307/296 R

FOREIGN PATENT DOCUMENTS 50-3075 1/1975 Japan.
53-143934 12/1978 Japan.

Primary Examiner—John Zazworsky
Attorney, Agent, or Firm—Parkhurst & Oliff

[57] ABSTRACT

In a circuit arrangement having a plurality of field effect transistors which are connected in series and operate simultaneously, the circuit arrangement is free from restriction of an operating frequency and it is not necessary to provide an individual power source for gate biasing, so that the construction of the circuit arrangement is simplified and the cost is reduced.

A gate drive pulse is applied to the gate of the field effect transistor (Q2) on a common potential point side. A parallel connection circuit having a first resistor (R3) and a first capacitor (C3) is coupled between the gate of the other field effect transistor (Q1) and the common potential point side. A parallel connection circuit having a second resistor (R4) and a second capacitor (C4) is coupled between the first electrode (e.g. drain) and the gate of the other field effect transistor. A capacitance of the first capacitor is larger than that of the second capacitor, so that the other field effect transistor is sufficiently shifted to a conductive state when the gate drive pulse is applied to the field effect transistor on the common potential side.

7 Claims, 7 Drawing Figures

FIELD EFFECT TRANSISTOR CIRCUIT ARRANGEMENT

DESCRIPTION

1. TECHNICAL FIELD

The present invention relates to a field effect transistor circuit arrangement having a plurality of insulated gate field effect transistors such as MOS type field effect transistors (referred to as MOS FET hereinafter) connected in series to be operable under a high voltage condition.

2. BACKGROUND ART

The voltage withstand between the drain and source of a MOSFET currently commercially available is substantially 400 V at most. Accordingly, in order to operate the MOSFET at 300 V or more for practical use, it is necessary to connect a plurality of MOSFETs in series to increase the voltage withstand. To this end, circuit arrangements as shown in FIGS. 1 and 2 have hitherto been used.

In a circuit arrangement shown in FIG. 1, a pulse transformer is employed to provide two or more gate drive signals which are isolated from each other. That is, in FIG. 1, a gate drive signal Vin is applied to a primary winding W1 of a pulse transformer PT. Individual output pulses obtained from secondary windings W2 and W3 are applied respectively to the gates of n-channel MOSFETs Q1 and Q2 connected in series. ZD1 and ZD2 are protective Zener diodes each for restricting the gate input signal so that a voltage between the gate and source does not exceed a breakdown voltage between the gate and source. The drain of the MOSFET Q1 is connected to a power source Vs via a load resistor RL and the source of the MOSFET Q1 is connected to the drain of the MOSFET Q2, the source of which is connected to a common potential point. This drive method which uses the pulse transformer has frequently been used for the series operation of bipolar transistors and thyristers, or the like. In the drive method, however, the operating frequency range of the gate drive signal Vin is limited by characteristics of the pulse transformer used and in particular the limited frequency range causes a problem when the operating frequency is low, ranging in the order to several KHz to 100 KHz so that the conduction period of time is long.

A circuit arrangement of FIG. 2 illustrates a drive method of the type in which a pulsive drive signal is applied to one of two elements for series operation and a DC voltage is applied to the other element. In FIG. 2, like reference numerals are used to designate like portions shown in FIG. 1. In the conventional drive method shown in FIG. 2, the gate drive signal Vin is directly applied to the gate of the MOSFET Q2 and a DC voltage Vdc is applied to the gate of another MOSFET Q1, through a parallel circuit consisting of a resistor R1 and a capacitor C1. A parallel circuit consisting of a resistor R2 and a capacitor C2 is connected between the gate and drain of the MOSFET Q1. Further, the resistors R1 and R2 form a voltage divider for determining an actual bias voltage applied to the gate of the MOSFET Q1. The capacitors C1 and C2 are used for correcting transient voltage share across the MOSFET Q1 at the time of the switching. The respective circuit constants of those resistors and capacitors have been selected to be $C1/C2 \approx R2/R1$ and the capacitance values of the capacitors C1 and C2 have been extremely small, for example, several tens pF. According to this drive method, the operating frequency range is not limited, unlike the method shown in FIG. 1. If, however, the power source voltage (e.g. 400 V) of the MOSFET is taken into consideration, it is necessary to provide a power source (e.g. 10 V) for the gate drive independently or to apply a given voltage from the power source of MOSFET to the gate of the MOSFET through a voltage dividing circuit having a large power consumption. In this respect, the drive method has problems in terms of cost and convenience.

DISCLOSURE OF INVENTION

Accordingly, an object of the present invention is to provide a field effect transistor circuit arrangement which, in driving field effect transistors connected in series, eliminates the defects of the above-described conventional drive methods without the restriction of the operating frequency and the provision of a separate DC power source.

According to this invention, in order to achieve the above object, there is provided a field effect transistor circuit arrangement including a plurality of field effect transistors, each having a first electrode (drain electrode) and a second electrode (source electrode) and a control electrode, which are connected in series between a power source voltage point and a common potential point, in which a control pulse is applied to the control electrode (gate electrode) of the field effect transistor on the side of the common potential point, a first parallel connection circuit having a first resistor and a first capacitor is coupled between the control electrode of each of the remaining field effect transistors and the common potential point, and a second parallel connection circuit having a second resistor and a second capacitor is coupled between the first parallel connection circuit and the first electrode of the corresponding field effect transistor, whereby the remaining field effect transistors are changed to a sufficiently conductive state at the time that the control pulse is applied to the field effect transistor on the side of the common potential point.

In a preferred embodiment of the present invention, a Zener diode is connected between the second electrode and the control electrode of each of the field effect transistors for the protection thereof so that a voltage applied between the control electrode and the second electrode of each of the corresponding field effect transistors does not exceed a breakdown voltage between the control electrode and the second electrode.

Another preferred embodiment of the invention has a third resistor for current restriction which is connected between the control electrode of each of the remaining field effect transistors and a connection point between the first and second parallel connection circuits.

Yet another preferred embodiment of the invention has fourth resistors each inserted between the first electrode and the second electrode of each of the field effect transistors, for correcting an unbalance of voltages shared by the respective field effect transistors due to variations of the characteristics of leak current between the first and second electrodes among the field effect transistors.

In still another embodiment of the invention, a series connection circuit having a fifth resistor and a third capacitor is connected between the first electrode and the second electrode of each of the field effect transistors, for correcting an unbalance of voltages shared by the corresponding field effect transistors due to variations of switching characteristics among the field effect transistors.

In the present invention, it is preferable to select a capacitance of the first capacitor to be larger than that of the second capacitor. The capacitance of the first capacitor is approximately 5 to 10 times of a static input capacitance of the corresponding field effect transistor. Furthermore, a capacitance of the second capacitor is selected to be within a range of about ⅔ to 1/several of the capacitance of the first capacitor.

According to one aspect of the present invention, there is provided a field effect transistor circuit arrangement including a plurality of field effect transistors having first and second electrodes and a control electrode, and a load which are connected in series between a power source voltage point and a common potential point, in which a control pulse is applied to the control electrode of the field effect transistor on the side of the common potential point, a parallel connection circuit having a resistor and a capacitor is connected between the common potential point and the control electrode of the field effect transistor adjacent to the field effect transistor on the side of the common potential point among the remaining field effect transistors, a plurality of circuits having resistors and capacitors connected in parallel are connected in series between the parallel connection circuit and the first electrode of the field effect transistor on the side of the power source voltage and respective connection points of these series connected circuits are connected sequentially and correspondingly to the respective control electrodes of the remaining field effect transistors, whereby the remaining field effect transistors are changed to a sufficiently conductive state at the time that the control pulse is applied to the field effect transistor on the side of the common potential point.

BRIEF DESCRIPTION OF DRAWINGS

FIG. 5 is a signal waveform diagram illustrating waveforms of a current and a voltage depicted when a MOSTFET is turned on.

BEST MODE FOR CARRYING OUT THE INVENTION

The present invention will be described in detail referring to the accompanying drawings.

Figure 1:
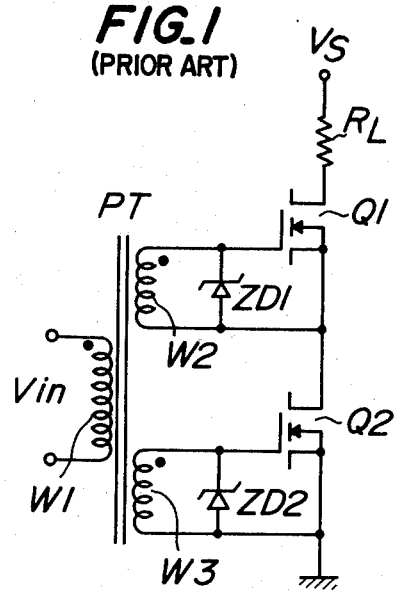
FIGS. 1 and 2 are circuit diagrams showing two embodiments of a conventional series connection type field effect transistor drive circuit.
Figure 2:
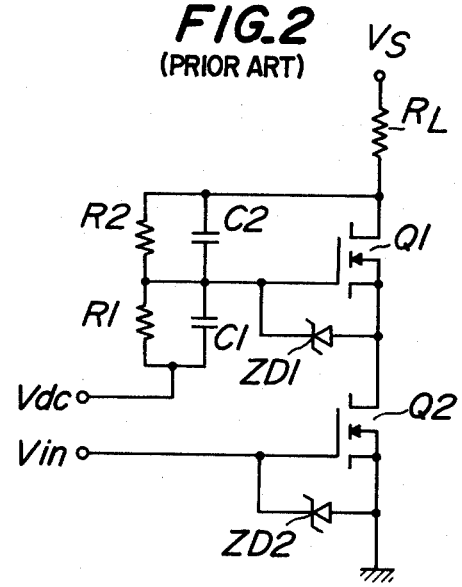
Figure 3:
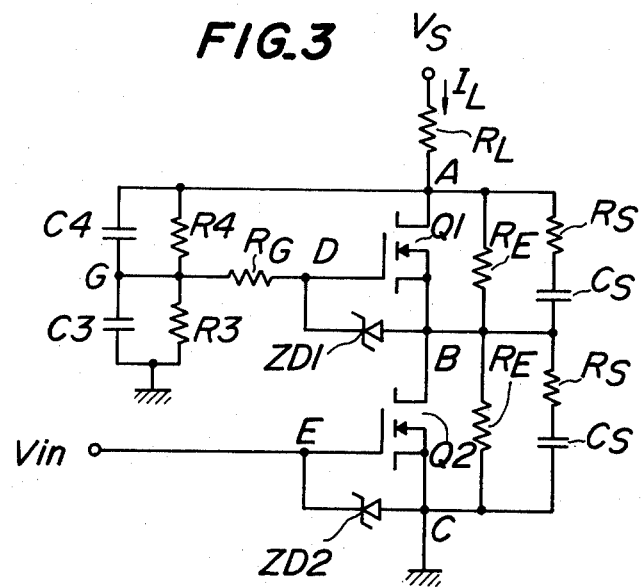
FIG. 3 is a circuit diagram showing an embodiment of a circuit arrangement of a field effect transistor drive circuit according to the present invention.

A circuit arrangement using two MOSFETs connected in series is illustrated in FIG. 3, as an embodiment of a field effect transistor circuit arrangement according to the present invention. In FIG. 3, like reference symbols are used for designating corresponding portions shown in FIG. 2. In the embodiment shown in FIG. 3, while the supply of a gate drive signal Vin to the gate (a node E) of a MOSFET Q2 is performed in a similar manner as that of the drive method shown in FIG. 2, a gate bias circuit for a MOSFET Q1 has the following construction. Between the gate (a node D) of a MOSFET Q1 and a common potential point is connected in series a current limiting resistor RG and a parallel circuit having a resistor R3 and a capacitor C3. Between a node G between the resistor RG and the parallel circuit R3, C3 and the drain of the MOSFET Q1 is connected a parallel circuit having a resistor R4 and a capacitor C4. The circuit having the resistors R3 and R4, and the capacitors C3 and C4 forms a gate bias circuit for providing a proper positive gate pulse to the gate of the MOSFET Q1 over a desired period of time. Note here that the gate bias circuit does not require the power supply thereto from an additionally provided DC power source, unlike the conventional circuit arrangement, and is connected merely between the power source Vs and the common potential point. The resistance values of the resistors R3 and R4 are selected to be such a high resistance as to provide sufficient voltage division for the leak current to the MOSFET Q1 and a Zener diode ZD1. In FIG. 3, between the drain (node A) and the source (node B) of the MOSFET Q1 is connected a parallel circuit having a resistor RE and a serial circuit having a resistor RS and a capacitor CS. Similarly, between the drain (node B) and the source (node C) of the MOSFET Q2 is connected a parallel circuit having a resistor RE and a serial circuit having the resistor RS and the capacitor CS. The resistors RE are used for correcting an unbalance of voltages shared by the MOSFETs Q1 and Q2 due to a difference between the leak current characteristics between the drains and the sources of the respective MOSFETs Q1 and Q2. The series circuits RS, CS are for correcting an unbalance of voltages shared by the MOSFETs Q1 and Q2 due to a difference between the switching characteristics of the MOSFETs Q1 and Q2.

In the circuit shown in FIG. 3, if the respective values of the resistors R3 and R4, and the capacitors C3 and C4 are determined in the same design manner as the respective values of the resistors R1 and R2, and the capacitors C1 and C2 in FIG. 2, the voltage $V_{DB}$ between the gate and the source of the MOSFET Q1 is lowered to several volts or less. Such a low voltage may insufficiently turn on the MOSFET Q1. In view of this problem, the resistances and the capacitances of those resistors and capacitors, particularly the capacitors C3 and C4 are determined in the following manner according to the invention.

Figure 4:
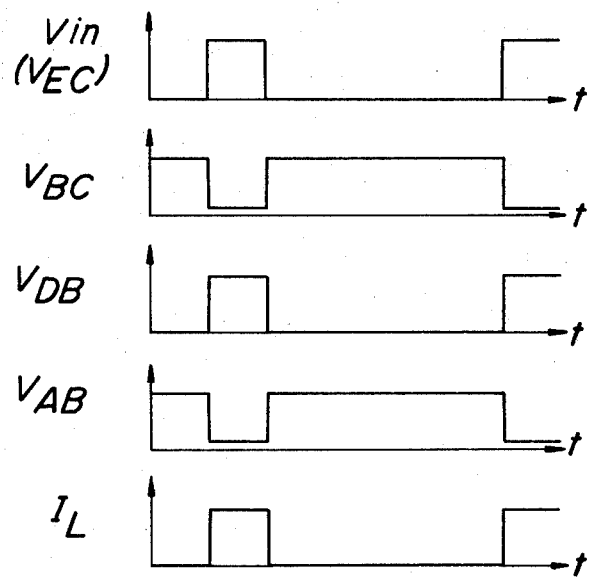
FIG. 4 is a signal waveform diagram illustrating examples of waveforms of voltages and currents at the respective portions of the circuit arrangement shown in FIG. 3.
Figure 5:
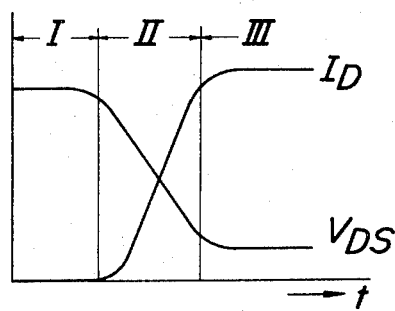

The manner of determining those values in accordance with the invention will be explained while the operation of the circuit arrangement of the present invention is explained. At the start of the operation of the circuit arrangement shown in FIG. 3, a charging voltage across the capacitor C3 is determined by a voltage division ratio of the resistors R3 and R4; when R3=R4, $V_{GC} = \frac{1}{2} V_s$. Consideration will be made of a situation that a gate drive signal Vin in the form of positive voltage pulse as illustrated in FIG. 4 is applied between the gate and source E–C of the MOSFET Q2. This signal Vin is a voltage between the nodes E and C and accordingly may be represented by $V_{EC}$. This representation will correspondingly be applied to the voltages between other related nodes hereinafter. Assume also that the gate drive signal Vin is larger than the threshold voltage (about 3 V) of the MOSFET Q2, for example, 10 V. The application of the gate drive signal Vin renders the MOSFET Q2 to a low impedance condition, so that the drain potential instantaneously falls to the source potential or a potential value close to the common potential. With the fall of the drain potential, the voltage $V_{BC}$ between the drain and source B–C of the MOSFET Q2 suddenly falls, as illustrated in FIG. 4. As a result, a positive voltage like the voltage $V_{DB}$ illustrated in FIG. 4 appears between the gate and source D–B of the MOSFET Q1, so that the MOSFET Q1 is switched to ON state.

Consideration will be further made in more detail with respect to the operation of the circuit arrangement during this process. The voltage $V_{DB}$ has at the initial part of its pulse a value obtained by subtracting a voltage across the resistor RG and the ON voltage across the MOSFET Q2 from a voltage across the capacitor C3. Concerning the current flowing at the time that the MOSFET Q2 is conductive, the current flows through a route G→RG→ZD1→drain-source path of Q2 C, when the potential at the node G is higher than the voltage sum of a Zener voltage $V_{z1}$ of the Zener diode ZD1 and the ON voltage of the MOSFET Q2. The current flows through a route G→RG→gate-source of Q1→drain-source of Q2→C when the potential at the node G is lower than the voltage sum of the Zener voltage $V_{z1}$ of the Zener diode ZD1 and the ON voltage of the MOSFET Q2. In this way, when the MOSFETs Q1 and Q2 are both turned on, a load current $I_L$ flows through the load resistor RL to the MOSFETs Q1 and Q2. The load current $I_L$ is determined by the ON resistances of the MOSFETs Q1 and Q2 and the load resistor RL. The ON resistance of the MOSFET Q2 is determined by the gate drive signal Vin and a forward transfer conductance of the MOSFET Q2 and the ON resistance of the MOSFET Q1 is also determined by the voltage $V_{DB}$ and a forward transfer conductance of the MOSFET Q1. Among those resistances existing in the main circuit RL→Q1→Q2, the load resistor RL has a fixed value and the ON resistance of the MOSFET Q2 is controlled by a crest value of a positive pulse voltage Vin ($V_{EC}$) applied between the gate and source of the MOSFET Q2 from exterior. Accordingly, in order to provide the load current $I_L$ with a sufficient magnitude, it is necessary to apply a proper positive voltage between the gate and source D–B of the MOSFET Q1 by the gate bias circuit R3, R4, C3 and C4.

When the MOSFETs Q1 and Q2 are both turned on, the potential at the node A is $Vs - I_L RL$. At this time, if C3=C4 and R3=R4, then the potential at the node G drops by $I_L \times RL/2$ from the initial value. As a result, there is a possibility that the MOSFET Q1 fails to maintain its ON state. In addition, if the MOSFETs Q1 and Q2 are turned on, the charge stored in the capacitor C3 discharges through the path of G→RG→ the input capacitance of the MOSFET Q1. An amount of charge discharged through this path is determined by the input capacitance of the MOSFET Q1, if the discharge by the leak currents flowing through the gate and source D–B of the MOSFET Q1 and the Zener diode ZD1 is negligible. In general, the input capacitance of the MOSFET greatly changes during its ON period. As seen from the waveforms of the drain current $I_D$ and the drain-source voltage $V_{DS}$ at the time of turning on, the input capacitance Cin of the MOSFET is so selected to have the maximum value in a phase II of three phases I, II and III of the turn-on period, and its value Cin (II) is given by the following equation:

$$Cin(II) = Ciss - AvCrss$$

where
$Av = \Delta Vds/\Delta Vgs$, where $\Delta Vds$ and $\Delta Vgs$ are increments of drain-source and gate-sources voltages respectively.
Crss=Cgd
Ciss: Static input capacitance described in a catalogue
Cgd: Capacitance between gate and drain described in the catalogue In an actual operation, the value Cin(II) may have a value ten times larger than the Ciss due to a Miller effect for the capacitance Cgd between the gate and drain. Accordingly, if the capacitance of the capacitor C3 is small and C3≃C4, the charge reallocation by the discharge through the capacitor C4 and the dynamic input capacitance of the MOSFET Q1 at the initial state of the turn-on does not bias sufficiently positively the voltage $V_{DB}$ between the gate and the source D–B of the MOSFET Q1. Therefore, the MOSFET Q1 was not turned sufficiently on.

As will be understood from the above consideration, in order to apply a sufficient positive bias voltage between the gate and source of the MOSFET Q1 over a period of the turn-on time, the present invention selects a value of the capacitor C3 to be 5 to 10 times larger than that of the capacitor C4 thereby to decrease the voltage drop rate across the capacitor C3 due to the discharge through the capacitor C4 over a turn-on transient period, and further to charge the dynamic input capacitor of the MOSFET Q1 up to a proper positive voltage. More particularly, the capacitance of the capacitor C3 is determined to be 5 to 10 times larger than the static input capacitance of the MOSFET Q1 in accordance with the pulse width and the capacitance of the capacitor C4 is selected to be approximately ⅔ to 1/several of the capacitance of the capacitor C3, so that the MOSFET Q1 is turned sufficiently on.

Let us consider now a turn-off period of the MOSFET Q1. The capacitance of the capacitor C3 is larger than that of the capacitor C4 and the resistance of the resistor R4 is large, and thus a voltage rise rate of the capacitor C3 is slow, so that the potential at the node B approaches faster to a value equal to ½ of the power source voltage than the potential at the node G. As a result, the charge current to the capacitor C3 flows from the node B through the Zener diode ZD1 in the conductive direction (where the voltage drops by about 0.6 to 0.7 V) and the resistor RG. As a result, the gate and source path of the MOSFET Q1 is inversely biased by about 0.6 to 0.7 V, thereby improving the turn-off speed.

Further, the resistor RG is for controlling the respective peak values of the discharge current to a path C3→RG→D→B→Q2→C during the turn-on period and the charging current to a path B→ZD1→RG→C3 during the turn-off period.

Specific values of the respective components in the circuit arrangement shown in FIG. 3 are illustrated below.
Power source voltage Vs: 400 V
Load resistor RL: 30Ω
MOSFETs Q1 and Q2: HEX2
Resistors R3=R4: 100 KΩ
Resistor RG: 200Ω
Static input capacitance (HEX2) Ciss: 450 pF
Capacitor C3=10×Ciss: 0.005 μF
Capacitor C4=(1/2.5) C3: 0.002 μF
Zener voltages $V_{Z1}$ and $V_{Z2}$: 19 V
Resistor Rs: 15Ω

Capacitor $C_5$: 0.0022 μF
Resistor $R_E$: 20 KΩ

In the circuit arrangement with the above-mentioned circuit constants, the maximum values of the voltages $V_{AB}$ and $V_{BC}$ were 200 V and the maximum value of the voltage $V_{DB}$ was 19 V and the maximum value of the current $I_L$ was 6 A, when the gate drive pulse Vin was 10 V.

Figure 6:
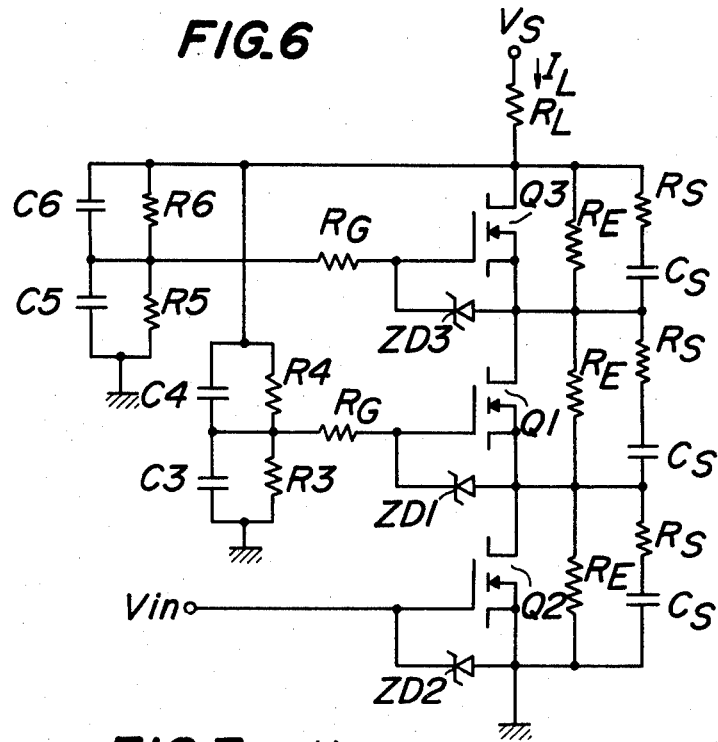
FIGS. 6 and 7 are circuit diagrams showing other embodiments of the present invention.

While the present invention has been described with reference to the embodiment of the circuit arrangement which employs two MOSFETs connected in series, it is clear that the invention is applicable to an FET transistor circuit arrangement having a desired numbers of (two or more) MOSFETs. An embodiment of a MOSFET transistor circuit arrangement according to the invention having a plurality of n MOSFETs connected in series is shown in FIG. 6. In FIG. 6, like reference symbols are used to designate corresponding portions in FIG. 3. In FIG. 6, Q3 is a MOSFET corresponding to the MOSFET Q1 and ZD3 is a protective Zener diode like the Zener diode ZD1. A gate bias circuit for the MOSFET Q3 is comprised of capacitors C5 and C6 and resistors R5 and R6. The capacitors C5 and C6 correspond respectively to the capacitors C3 and C4; the resistors R5 and R6 correspond respectively to the resistors R3 and R4. The condition for selecting the capacitances of the capacitors C5 and C6 corresponds to that of the capacitors C3 and C4 and therefore no detailed description will be given here.

Figure 7:
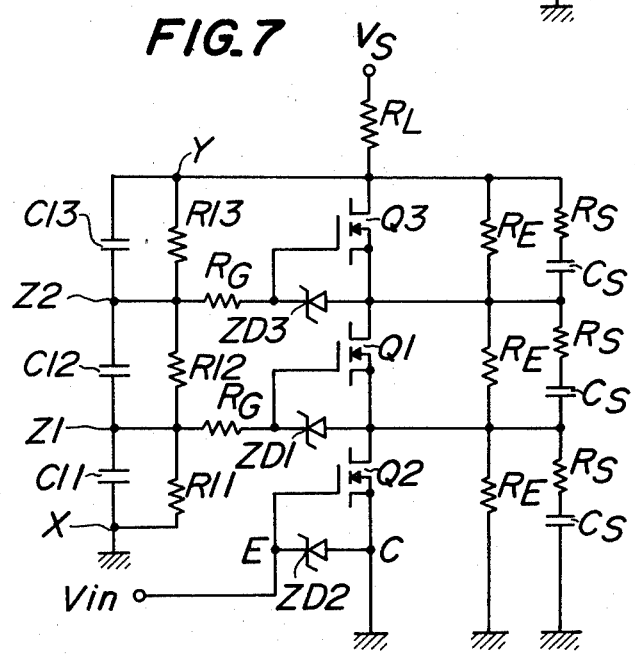

FIG. 7 shows another embodiment of a circuit arrangement according to the invention in which three or more MOSFETs are connected in series. In FIG. 7, like portions are designated by like reference symbols used in FIG. 6. In this embodiment, parallel connection circuits respectively having pairs of a resistor R11 and a capacitor C11, a resistor R12 and a capacitor C12, and a resistor R13 and a capacitor C13, are connected in series. The series connection circuit including those parallel connection circuits has one end X connected to a common potential point and the other end Y connected to the drain of the MOSFET Q3 on the side of the power source. The nodes Z1 and Z2 between the adjacent parallel connection circuits are connected to the gates of the corresponding MOSFETs Q1 and Q3, respectively. The capacitances of those capacitors C11, C12 and C13 are so selected that the capacitance of the capacitor C11 on the side of the common potential is the greatest and the subsequent capacitors are stepwisely reduced in the sequence of the capacitor connecting order; i.e., C11 C12 C13. The respective capacitances of the capacitors C11, C12 and C13 are each about 5 to 10 times larger than the input capacitance of the respective MOSFETs. The resistances of the resistors R11, R12 and R13 may be selected to be equal to one another. While the embodiment shown in FIG. 7 uses three MOSFETs connected in series, the number of the MOSFETs may be increased, if necessary, as a matter of course.

While in the above-mentioned embodiments, the present invention has been explained in the case of n-channel MOSFETs, the present invention can be applied to a series connection circuit arrangement having p-channel MOSFETs, junction FETs (J FET), MONOS FETs, or other insulated gate field effect transistors.

INDUSTRIAL APPLICABILITY

As described above, the field effect transistor circuit arrangement according to the invention uses a gate bias circuit which does not require an additional DC power source in order to control the ON and OFF of the respective gate of the field effect transistors connected in series. Therefore, unlike the gate drive by a pulse transformer, the circuit arrangement is free from the restriction of the operating frequency and operable without an additional power source. Consequently, the invention greatly contributes the reduction of costs of the circuit arrangement of this type.

I claim:

1. A field effect transistor circuit arrangement including a plurality of field effect transistors having first and second electrodes and a control electrode, and a load (RL), which are connected in a series arrangement between a power source voltage point (Vs) and a common potential point (C), comprising:

means for applying a control pulse (Vin) to the control electrode of one of said field effect transistors which is connected in said series arrangement on the side of the common potential point;

at least one first parallel connection circuit having a first resistor and a first capacitor, each first parallel connection circuit being coupled between the control electrode of a respective one of the remaining field effect transistors and the common potential point;

at least one second parallel connection circuit having a second resistor and a second capacitor, each second parallel connection circuit being coupled between a respective first parallel connection circuit and the first electrode of one of said remaining field effect transistors which is connected in said series arrangement on the side of the power source voltage point, a capacitance of said first capacitor in said first parallel connection circuit being larger than that of said second capacitor in said second parallel connection circuit;

a Zener diode connected between the second electrode and the control electrode of each of said field effect transistors for preventing a voltage applied therebetween from exceeding a predetermined breakdown voltage between the control electrode and second electrode of each of said field effect transistors; and said remaining field effect transistors being changed to a conductive state at the time that said control pulse is applied to said one field effect transistor.

2. A field effect transistor circuit arrangement as claimed in claim 1, in which a third resistor ($R_G$) for current restriction is connected between said control electrode of each of said remaining field effect transistors and a connection point between said first and second parallel connection circuits.

3. A field effect transistor circuit arrangement as claimed in claim 2, wherein fourth resistors are respectively inserted between said first electrodes and said second electrodes of said field effect transistors, for correcting an unbalance of voltages shared by said field effect transistors due to variations of the characteristics of leak current between said first and second electrodes among said field effect transistors.

4. A field effect transistor circuit arrangement as claimed in claim 3, in which a series connection circuit having a fifth resistor and a third capacitor is connected between said first electrode and said second electrode of each of said field effect transistors, for correcting an unbalance of voltages shared by said field effect transistors due to variations of switching characteristics among said field effect transistors.

5. A field effect transistor circuit arrangement as claimed in claim 1, in which the capacitance of said first capacitor is approximately 5 to 10 times larger than a static input capacitance of a respective field effect transistor.

6. A field effect transistor circuit arrangement as claimed in claim 1, in which a capacitance of said second capacitor is selected to be about ⅔ to 1/several of the capacitance of said first capacitor.

7. A field effect transistor circuit arrangement including a plurality of field effect transistors having first and second electrodes and a control electrode, and a load which are connected in a series arrangement between a power source voltage point (Vs) and a common potential point (C), comprising:
   means for applying a control pulse (Vin) to the control electrode of one of said field effect transistors which is connected in said series arrangement on the side of the common potential point;
   a first parallel connection circuit having a resistor and a capacitor coupled between the common potential point and the control electrode of one of the remaining field effect transistors which is connected in said series arrangement adjacent to the field effect transistor which is connected on the side of the common potential point;
   a plurality of additional parallel connection circuits each having a resistor and a capacitor connected in parallel, said plurality of additional parallel connection circuits being connected in series between said first parallel connection circuit and the first electrode of one of said field effect transistors which is connected in said series arrangement on the side of said power source voltage, the capacitance of the capacitors in said first and plurality of additional parallel connection circuits being so selected that the capacitance of the capacitor of said first parallel connection circuit is the greatest and the subsequent capacitors in the series connection of said additional parallel connection circuits are stepwisely reduced in capacitance in the sequence of the connecting order of said additional parallel connection circuits and that the respective capacitances of the capacitors of said first and additional parallel connection circuits are each about 5 to 10 times larger than the input capacitance of a respective one of said remaining field effect transistors;
   respective connection points of said series connected first and plurality of additional circuits being electrically coupled to respective control electrodes of said remaining field effect transistors;
   a Zener diode connected between the second electrode and the control electrode of each of said field effect transistors for preventing a voltage applied therebetween from exceeding a predetermined breakdown voltage between the control electrode and second electrode of each of said field effect transistors; and
   said remaining field effect transistors being changed to a conductive state at the time that said control pulse is applied to said one field effect transistor connected on the side of the common potential point.

* * * * *